US008879277B2

(12) United States Patent
Baran et al.

(10) Patent No.: US 8,879,277 B2
(45) Date of Patent: Nov. 4, 2014

(54) DRIVE MODULARITY

(75) Inventors: Michael S. Baran, Milwaukee, WI (US);
Michael J. Nelson, Prior Lake, MN (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 252 days.

(21) Appl. No.: 13/407,825

(22) Filed: Feb. 29, 2012

(65) Prior Publication Data

US 2012/0158160 A1 Jun. 21, 2012

Related U.S. Application Data

(62) Division of application No. 11/939,319, filed on Nov. 13, 2007, now Pat. No. 8,149,587.

(51) Int. Cl.
*H05K 7/14* (2006.01)
*H05K 7/18* (2006.01)

(52) U.S. Cl.
CPC .................................. *H05K 7/1485* (2013.01)
USPC ............................. 361/798; 709/224; 709/227

(58) Field of Classification Search
USPC ........... 361/798, 686; 310/68 R, 268, 156.37; 709/224, 227, 203, 206; 395/750.08, 395/182.12, 750.01
See application file for complete search history.

(56) References Cited

U.S. PATENT DOCUMENTS

| | | | |
|---|---|---|---|
| 5,301,303 A * | 4/1994 | Abraham et al. | 709/223 |
| 5,842,030 A | 11/1998 | Larabell et al. | |
| 6,651,100 B2 | 11/2003 | Bush et al. | |
| 6,661,671 B1 | 12/2003 | Franke et al. | |
| 6,822,874 B1 | 11/2004 | Marler | |
| 7,478,006 B2 | 1/2009 | Odom | |
| 2004/0192490 A1 | 9/2004 | DiCarlo | |
| 2005/0081662 A1 | 4/2005 | Bouche | |
| 2008/0024044 A1 | 1/2008 | Palmer et al. | |
| 2013/0057073 A1* | 3/2013 | Masciarelli et al. | 307/66 |

OTHER PUBLICATIONS

OA dated Jul. 22, 2011 for U.S. Appl. No. 11/939,319, 17 pages.

* cited by examiner

*Primary Examiner* — Hung S Bui
(74) *Attorney, Agent, or Firm* — Amin, Turocy & Watson, LLP

(57) ABSTRACT

A modular industrial drive system includes a base that receives one or more control modules as a face template. The control modules provide a set of functionalities to the drive system, and the face template serves as a user interface to the drive system. The drive system can include a power module and a control module which define desired functionalities for the system.

20 Claims, 10 Drawing Sheets

DRIVE MODULARITY

CROSS-REFERENCE TO RELATED CASES

This application is a division of U.S. patent application Ser. No. 11/939,319, filed Nov. 13, 2007, and entitled DRIVE MODULARITY, the entirety of which is incorporated herein by reference.

The claimed subject matter relates generally to industrial control systems and more particularly to drive power and control systems where drive control modules are separable from associated power modules to facilitate desired drive functionality.

BACKGROUND

A motor controller or drive is a device or group of devices that serves to govern in some predetermined manner the performance of an electric motor. A drive can include a manual or automatic means for starting and stopping the motor, selecting forward or reverse rotation, selecting and regulating the speed, regulating or limiting the torque, and protecting against overloads and faults, for example. Many industrial applications are dependent upon motors (or machines), which range from the very small to the size of a railroad locomotive. The motor controllers or drives can be built into the driven equipment, installed separately, installed in an enclosure along with other machine control equipment.

An electric motor controller can be classified by the type of motor it is to drive such as permanent magnet, servo, series, separately excited, and alternating current. The motor controller is connected to a power source such as a battery pack or power supply, and control circuitry in the form of analog or digital input signals. Recent developments in drive electronics have allowed efficient and convenient acceleration, speed, and position control of these motors, where this has not traditionally been the case. The newest advancements allow for torque generation down to zero speed. This allows a polyphase AC induction motor to compete in areas where DC motors have long dominated, and present an advantage in robustness of design, cost, and reduced maintenance.

Phase vector drives (or simply vector drives) are an improvement over variable frequency drives (VFD) in that they separate the calculations of magnetizing current and torque generating current. These quantities are represented by phase vectors, and are combined to produce the driving phase vector which in turn is decomposed into the driving components of the output stage. Unlike a VFD, a vector drive is a closed loop system. It takes feedback on rotor position and phase currents. Rotor position can be obtained through an encoder, but is often sensed by the reverse EMF generated on the motor leads. In some configurations, a vector drive may be able to generate full rated motor torque at zero speed.

Another aspect of drives includes brushed DC Motor Speed or Torque Controls. These controls are applicable to brushed DC motors with either a wound or permanent magnet stator. A valuable characteristic of these motors is that they are easily controlled in torque, the torque being fairly directly proportional to the driving current. Speed control is derived by modulating the motor torque. SCR controls for DC motors derive power from AC power, and send rectified voltage to the motor. These controls are very common in industry, running from line voltages, with motors rated at 90V for 120V line, and 180V for a 240V line. These are available in reversing and non-reversing models and are robust, with a minimum of electronic components. The waveform sent to the motor can have strong harmonic components due to the switching at line frequency. This results in current and torque ripple, and an audible hum.

Pulse width modulated (PWM) controls use pulse width modulation to regulate the current sent to the motor. Unlike SCR controls which switch at line frequency, PWM controls produce smoother current at higher switching frequencies, typically between 1 and 20 kHz. At 20 kHz, the switching frequency is inaudible to humans, thereby eliminating the hum which switching at lower frequency produces. However, some motor controllers for radio controlled models make use of the motor to produce audible sound, most commonly simple beeps.

In the past, regardless of the type of motor controller or drive employed, power electronics and control electronics for the drive were integrated into a common control package or platform. Thus, traditional industrial manufacturing drives feature fixed, immovable hardware. The drawback to these traditional drives is that technology is constantly improving. Most manufacturing companies are faced with the option of replacing an entire drive, or settling for out-dated technology that does not accurately meet their needs. The current competitive business world makes both of these options unappealing.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

Drive modularity is provided where control and other functionality are easily separable from associated power electronics to facilitate scalability of a platform while mitigating system changes. The platform is partitioned in a manner to allow new features and hardware to be added after an initial installation with minimal disturbance to the existing base. Modularity allows features to be added (e.g., control/interface/performance) and subtracted such that scaling of the platform and feature additions pose minimized risk to the previously qualified functionality (e.g., qualified installations have minimal wiring changes during upgrades). By changing a limited subset of modules, such as a power module and control module for example, great flexibility is achieved in the power consumption/distribution and control/user interface areas respectively. The modules can snap onto an existing base with simple plastic tabs (and/or other joining mechanisms), and are released by pressing a few buttons. The result is a dramatic increase in product longevity since by simply snapping on a new module, the drive is effectively upgraded. The substantial cost and hassle of replacing an entire drive are mitigated. Another advantage is that users can build their own drive configuration "catalog number" instead of selecting from a fixed list of catalog numbers e.g., pairing one of four control module catalog numbers with one of twenty power modules effectively allows only 24 catalog numbers to create what would have been 80 catalog numbers if these combinations were paired at the factory. Thus, this is an advantage for both the manufacturer and the user.

To the accomplishment of the foregoing and related ends, certain illustrative aspects are described herein in connection with the following description and the annexed drawings. These aspects are indicative of various ways which can be practiced, all of which are intended to be covered herein.

Other advantages and novel features may become apparent from the following detailed description when considered in conjunction with the drawings.

DETAILED DESCRIPTION

An industrial control architecture is provided. In one aspect, a modular industrial drive system includes a base that receives one or more control modules as a face template. The control modules provide a set of functionalities to the drive system, and the face template serves as a user interface to the drive system. The drive system can include a power module and a control module which define desired functionalities for the system.

It is noted that as used in this application, terms such as "component," "module," "drive," and the like are intended to refer to a computer-related entity, either hardware, a combination of hardware and software, software, or software in execution as applied to an automation system for industrial control. For example, a component may be, but is not limited to being, a process running on a processor, a processor, an object, an executable, a thread of execution, a program and a computer. By way of illustration, both an application running on a server and the server can be components. One or more components may reside within a process and/or thread of execution and a component may be localized on one computer and/or distributed between two or more computers, industrial controllers, and/or modules communicating therewith.

Figure 1:
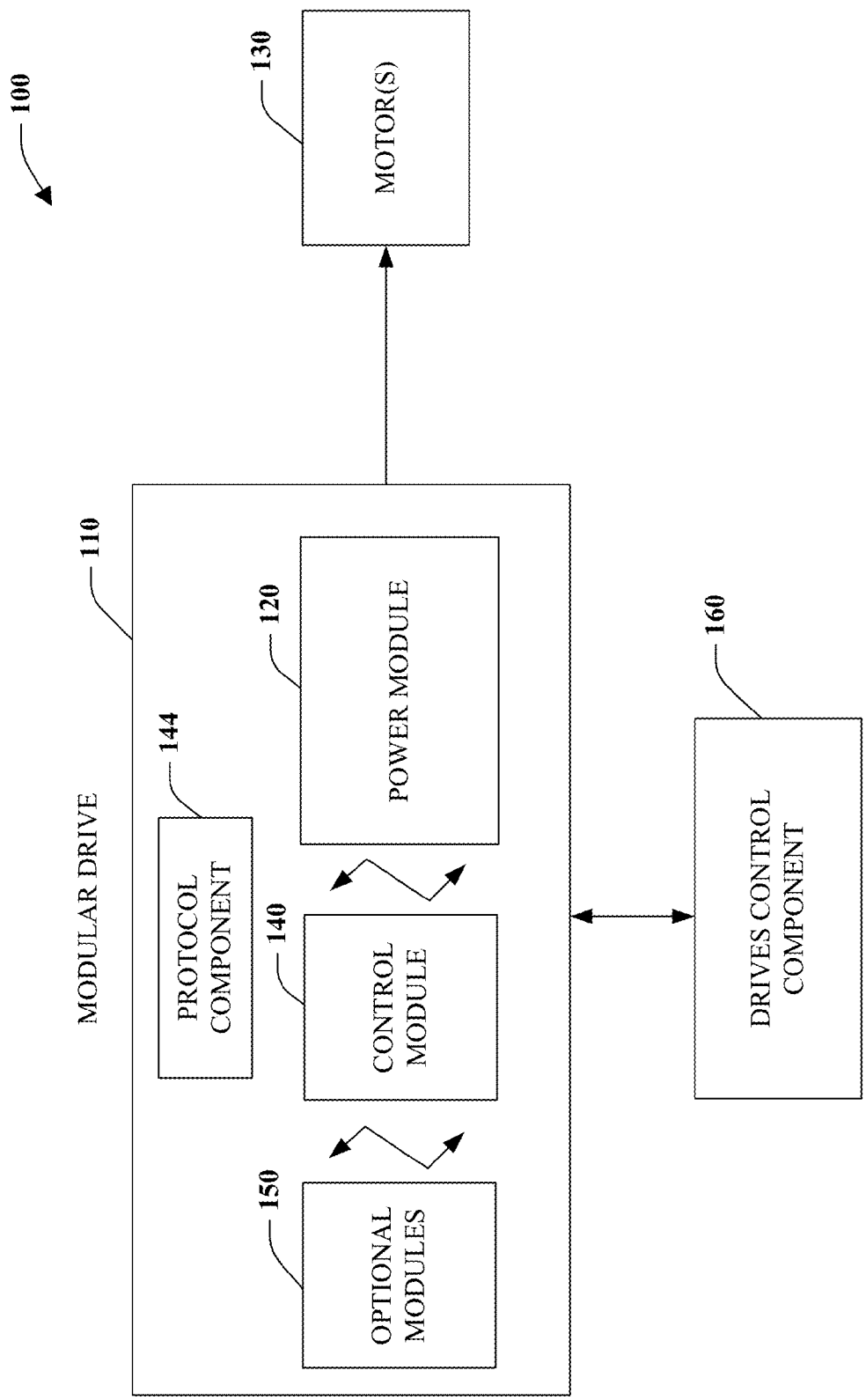
FIG. 1 is a schematic block diagram illustrating modular drive for an industrial automation system.

Referring initially to FIG. 1, a modular drive for an industrial automation system 100 is provided. The system 100 includes a modular drive 110 having a power module 120 that generally provides control connections to a motor 130. The power module 120 is operably coupled to a control module 140, where couplings can include electrical connections for communications between the power module and the control module. Also, mechanical couplings are provided such that the control module 140 is easily attached to and separable from the power module 120. A protocol component 144 is provided between the control module 140 and the power module 120 to allow the respective modules to identify functionality between the modules. For example, the control module 140 may identify its capabilities to the power module 120 and/or determine its capabilities based off of data received from the power module. The control module 140 can also include network functionality for interacting with users over remote networks such as the Internet, for example. As an alternative aspect, one or more optional modules 150 can be cascaded in line with the control module 140 to add additional processor, control, communications and/or interface functionality. As shown, a external control system 160 sends commands to the modular drive 110 in order to control movement of the motor 130. It is noted that in an alternative aspect, the external control system 160 can be incorporated within the control module 140 and/or the power module 120.

In general, drive modularity is provided by the modular drive 110 where control and other functionality are easily separable from associated power electronics to facilitate scalability of a motor control platform while mitigating system changes. The platform is partitioned in a manner to allow new features and hardware to be added after an initial installation with minimal disturbance to the existing base provided by the power module 120. Modularity allows features to be added (e.g., control/interface/performance) and subtracted such that scaling of the platform and feature additions pose minimized risk to the previously qualified functionality (e.g., qualified installations have minimal wiring changes during upgrades). By changing a limited subset of modules such as the power module 120, control module 140, or optional modules 150, for example, great flexibility is achieved in the power consumption/distribution and control/user interface areas respectively. The modules can snap onto an existing base with simple plastic tabs (and/or other joining mechanisms), and are released by pressing a few buttons or other coupling components. The result is a dramatic increase in product longevity since by simply coupling the control module 140, the modular drive 110 is effectively upgraded. Thus, substantial cost and hassle of replacing an entire drive are mitigated. It is noted that the converse of replacing a power module instead of control module is also useful in the following instances: 1) the power module is more likely to reach an end of electrical life than the control module in the circumstance of typically experienced problems (misapplication, overload, and so forth), or 2) a common machine upgrade path is to increase a motor size which would also utilize a larger power module.

It is noted that components associated with the system 100 can include various computer or network components such as servers, clients, programmable logic controllers (PLCs), communications modules, mobile computers, wireless components, control components and so forth which are capable of interacting across a network. Similarly, the term PLC as used herein can include functionality that can be shared across multiple components, systems, and/or networks. For example, one or more PLCs can communicate and cooperate with various network devices across the network. This can include substantially any type of control, communications Module, computer, I/O device, sensor, Human Machine Interface (HMI)) that communicate via the network which includes control, automation, and/or public networks. The PLC can also communicate to and control various other devices such as Input/Output modules including Analog, Digital, Programmed/Intelligent I/O modules, other programmable controllers, communications modules, sensors, output devices, and the like. In another aspect, an industrial drive system is provided. This includes means for isolating power functionality within a base unit (power module 120) and means for providing control functionality to the base unit (control module 140). This can also include means for interfacing to the control functionality (component 160), The network can include public networks such as the Internet, Intranets, and automation networks such as Common Industrial Protocol (CIP) networks including DeviceNet and ControlNet. Other networks include Ethernet, DH/DH+, Remote I/O, Fieldbus, Modbus, Profibus, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 2:
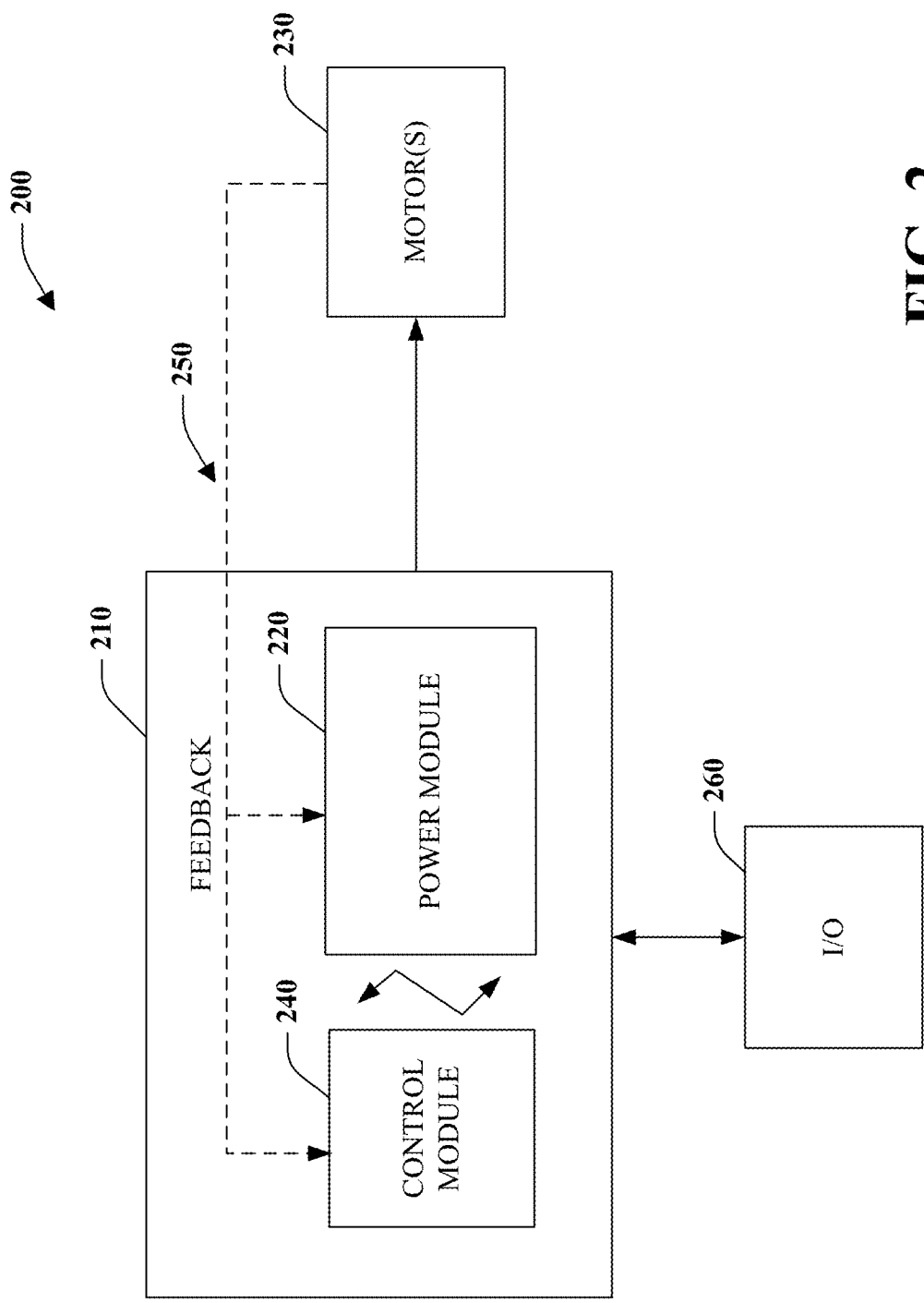
FIG. 2 is a diagram that illustrates feedback and I/O connections for a modular drive.

Turning to FIG. 2, a system 200 illustrates feedback and I/O connections for a modular drive 210. The system 200 includes the modular drive 210 having a power module 220 that generally provides control connections to a motor 230. The power module 230 is coupled to a control module 240, where couplings can include electrical connections for communications between the power module and the control module. Also, mechanical couplings are provided such that the control module 240 is easily attached to and separable from the power module 220. As shown, one or more feedback connections 250 are received from the motor 230. In one aspect, the feedback connections 250 are processed by the control module 240 and in an alternative aspect, the feedback connections 250 are received by the power module 220 before processing by the control module. As can be appreciated, processing can occur on both the power module 220 and the control module 240 concurrently in other aspects. One or more input/output (I/O) connections 260 can be processed by the modular drive 210. In general, I/O 260 is processed by the control module 240 but similar to the feedback 250, the power module 220 can also process the I/O in accordance with alternative aspects.

Figure 3:
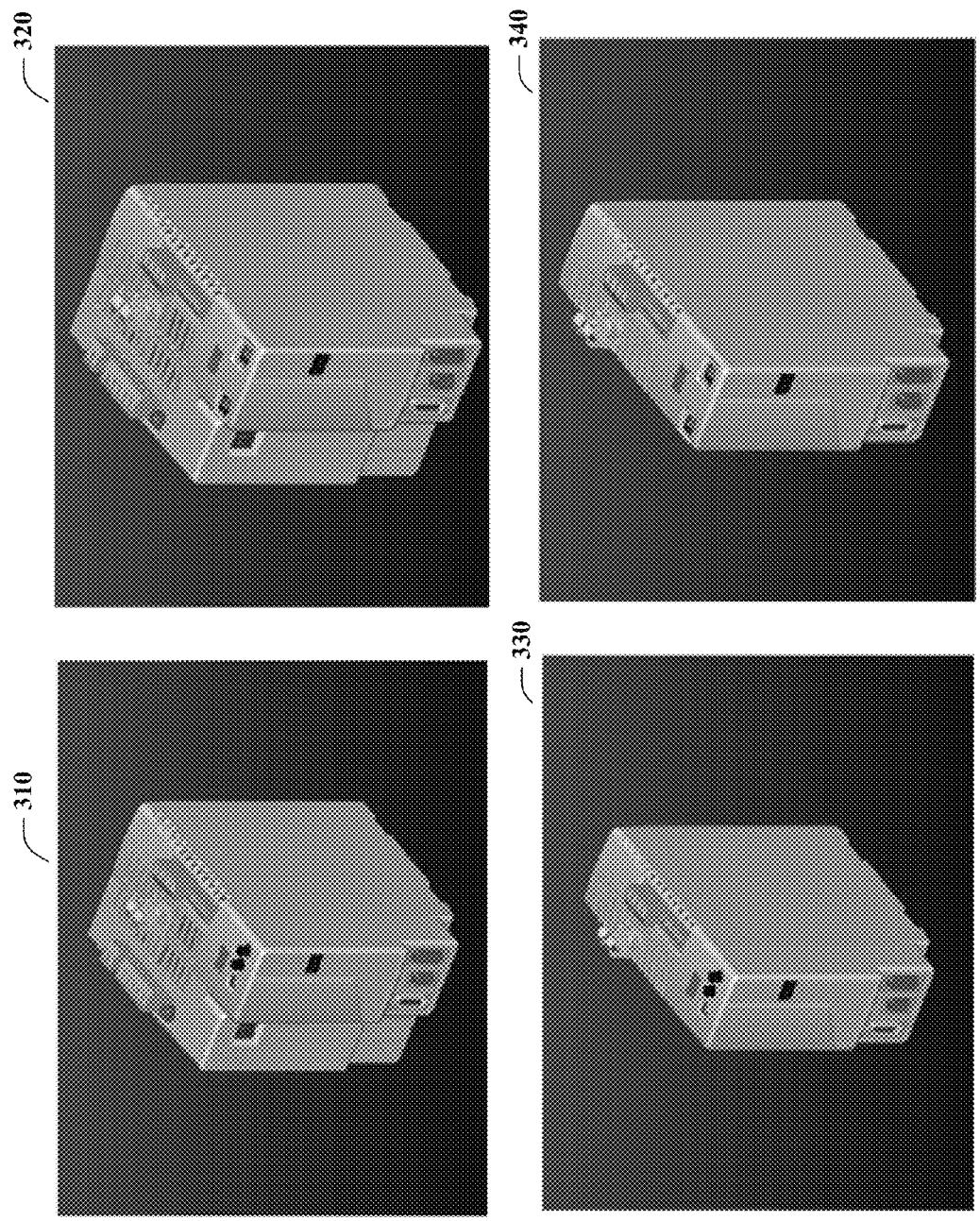
FIG. 3 is a diagram of example packaging views for a modular drive.

Referring now to FIG. 3, various example package views for a modular drive are illustrated. Before proceeding, it is noted that the modules shown in FIGS. 3-7 are provided as one possible example yet are not limited to the respective examples shown. For instance, connection diagrams for power and control modules can have more or less than the respective connections shown and can have other types of functionality than shown. Similarly, depictions of how a power and control module may be coupled are but one form of coupling that can be provided. For example, although snap connections are shown, substantially any type of coupling between a power and control module that facilitates insertion and removal of the control module from the respective power module can be provided e.g., screw connections.

At 310, a fiber optic communications Integrated Axis Module (IAM) is illustrated, where an Ethernet version of the IAM is illustrated at 320. At 330, a fiber optic Axis Module (AM) is illustrated, where an Ethernet version of the AM is shown at 340. The modular drives provide a multi-axis, backplane mounted drive system. The system can include:
   Integrated Axis Module (IAM)—converter for entire system and one inverter
   Axis Modules (AMs)—single-axis inverters, from zero up to seven (or more)
   Power Rail—backplane that connects the DC bus and control electronics.

The power structures or modules can be provided separately from the control structures or modules, where users mate the power and control structures together depending on their applications. EtherNet/IP models support an integrated architecture implementation of the open CIP (Common Industrial Protocol). This includes Motion network, an Ethernet-based communication network based on standard CIP protocol and the IEEE 1588 standard for time synchronization. In another aspect, SERCOS models support SERCOS network implementation of optical communications technologies. It is to be appreciated that other communications protocols can be provided.

Figure 4:
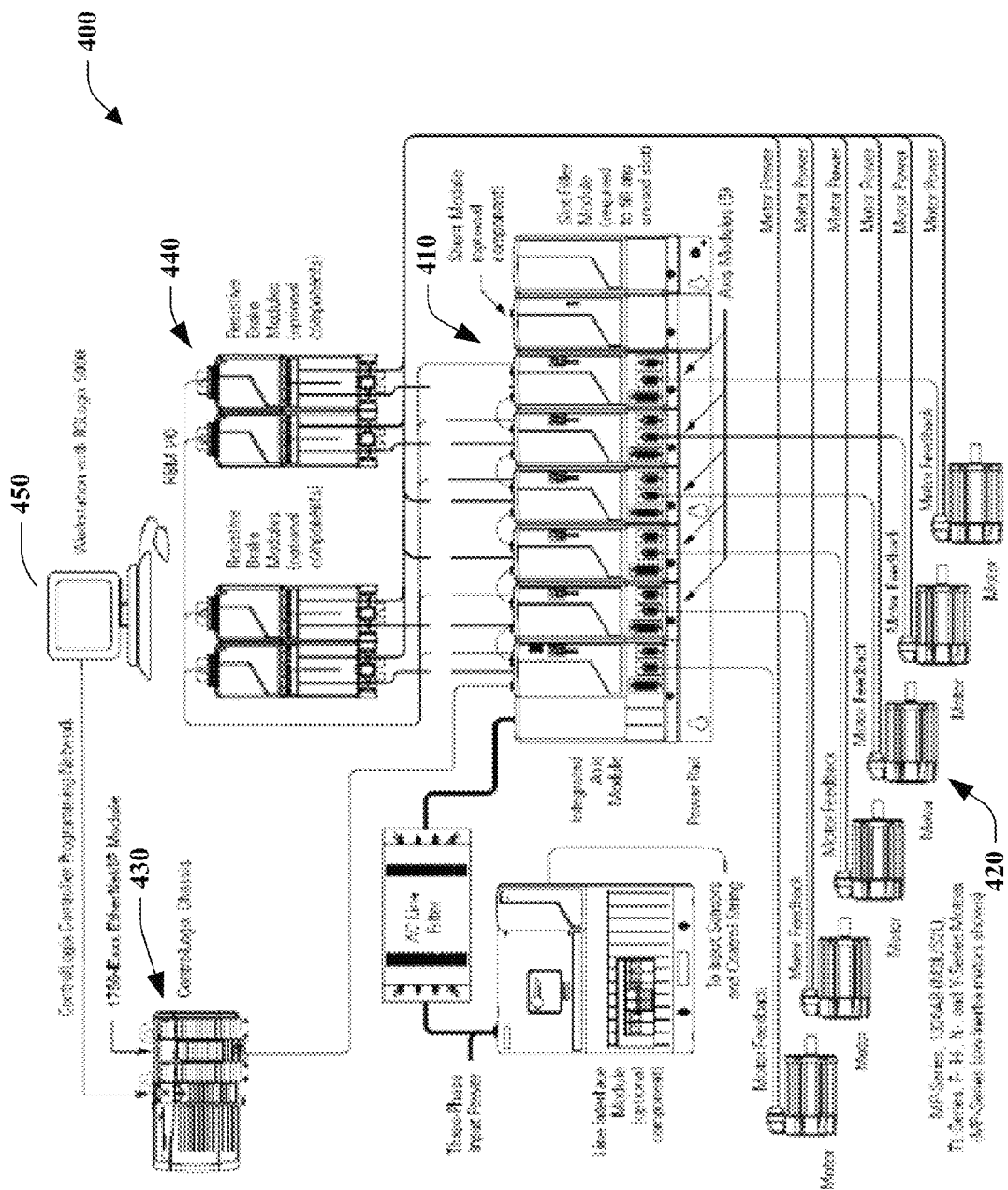
FIG. 4 illustrates a system view that employs modular drives for a plurality of motors.

Referring to FIG. 4, an example system view 400 is illustrated that employs modular drives for a plurality of motors. As shown, a bank of modular drives 410 are shown that are controlling a plurality of motors 420. Although six motors and respective drives are shown in this example, it is to be appreciated that more or less than six can be employed. Some other possible components in the system 400 include a programmable controller 430 that sends commands and receives data from the drives 410. Brake modules 440 can be provided for stopping the motors 420 and a workstation 450 can be provided to allow users to access the system 400.

Figure 5:
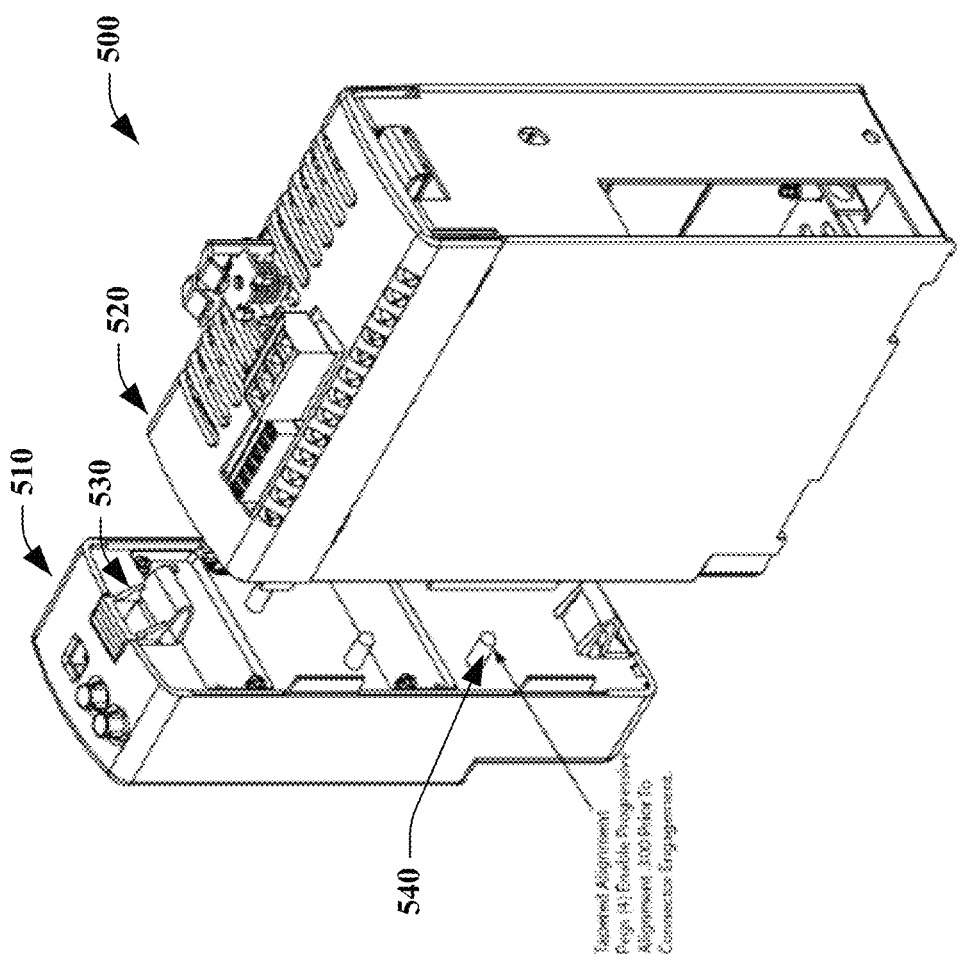
FIG. 5 illustrates an example installation view for a control and power module of a modular drive.

Turning to FIG. 5, an example installation view 500 is illustrated for a control and power module of a modular drive. As shown, a control module 510 can be installed with a power module 520. As noted above, it is possible that other control or functional modules (not shown) could be installed in cascade with the control module to increase the functionality of the drive. Snapping or locking tabs (or other style fastening means) can be employed to couple the control module 510 and the power module 520. Various electronic couplings for communications between the modules are provided. In general, the modular drives are designed for field installation of the control module 510 onto a power module 520. It is desirable that the attachment and removal of the control module 510 should not employ any tools (some aspects may employ a screwdriver or some commonly available tool), nor should the user need plug/unplug any high voltage or high power cables. The mating of the power/control interface connectors (not shown) can be aligned through mechanical features of the packaging. In this example, the control module 510 illustrates one or more alignment pegs 540 that serve to position the connectors prior to mating.

Figure 6:
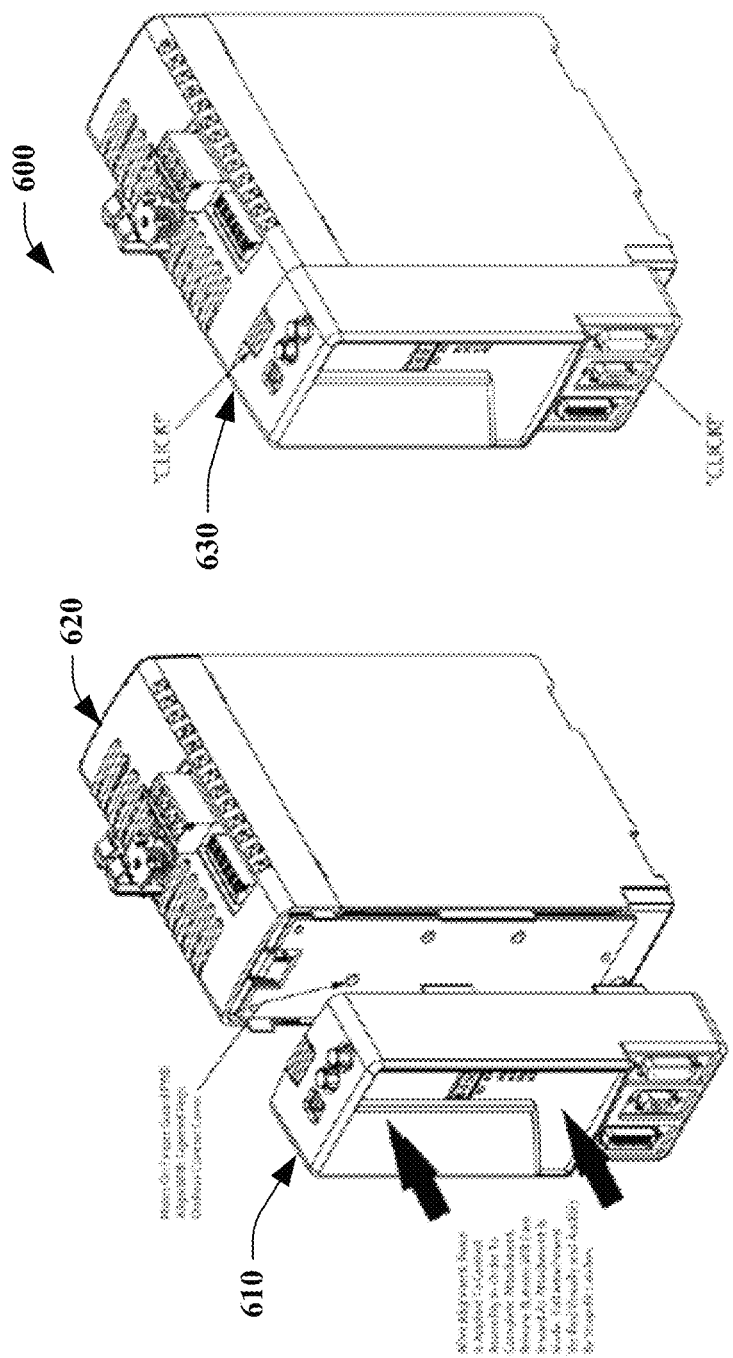
FIG. 6 illustrates an alternative installation view for a control and power module of a modular drive.

Referring to FIG. 6, an alternative installation view 600 is illustrated for a control module and a power module 620 of a modular drive. The following procedure can be employed to install the control module 610 onto the power module 620:
   1. Fasten the power module onto a power rail when power is not applied to the system.
   2. Line up alignment pins in the rear of the control module 610 with the holes in the front of the power module 620, and plug the control module 610 into the power module 620. The control module 610 should remain parallel with the front of the power module, and is not pivoted. In another aspect, a control module can employ a pivot axis near the bottom as a primary alignment feature.
   3. When properly installed, the control module 610 should be flush with the power module 620 as shown at 630 and the module release buttons should be in their relaxed position. An audible click signifies the module release buttons snapping into their relaxed position as shown at 630.

Figure 7:
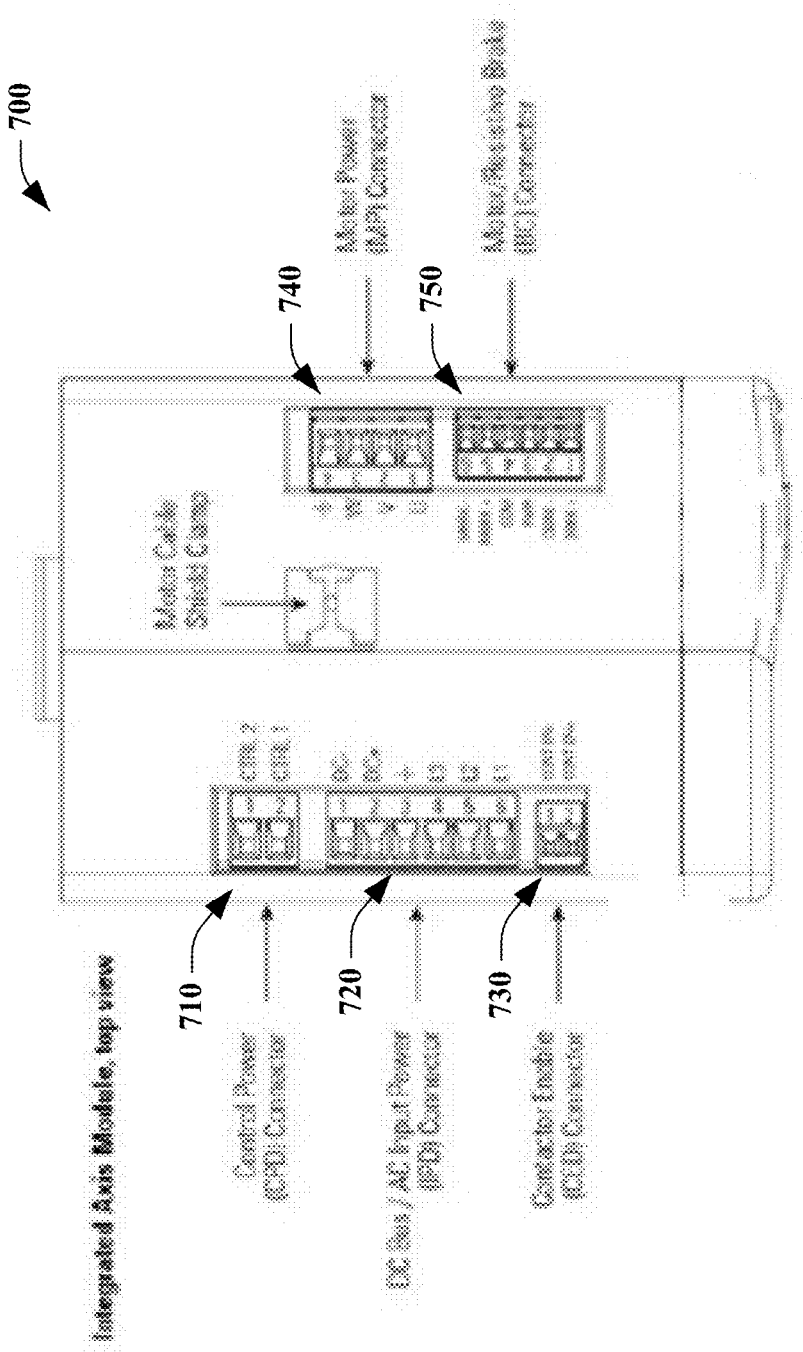
FIG. 7 is a power connections view for a modular drive.

FIG. 7 shows a power connections view 700 for a modular drive. In this example, a top view of an inverter/converter power module is illustrated at 700 that shows the locations of power connections. The power connections are located on the top of the modules but other locations are possible. The connections include a Control Power (CPD) 710, a DC Bus/AC Input Power 720 (IPD), and a Contactor Enable (CED) connector 730, where motor power and brake connectors are shown at 740 and 750 respectively. The following tables describe the power connections available. The contactor enable outputs are intended to control an AC contactor that supplies power to the IPD connector 720. Although use of a main AC input contactor is not required, it is recommended so the drive can disconnect input power in the event of a failure. The following table shows connections for the connector 720:

| Pin | Description | Mnemonic |
|---|---|---|
| 1 | An integral, unregulated power supply. consisting of AC line input. 3-phase bridge rectifier, and filter capacitors. | DC− |
| 2 | An integral, unregulated power supply. consisting of AC line input. 3-phase bridge rectifier, and filter capacitors. | DC+ |
| 3 | Chassis ground | GND |
| 4 | 3-phase input power | L3 |
| 5 | 3-phase input power | L2 |
| 6 | 3-phase input power | L1 |

The following table shows the control power connector 710:

| Pin | Description | Mnemonic |
|---|---|---|
| 1 | Control power VAC input L1 | CTRL 2 |
| 2 | Control power VAC input L2 | CTRL 1 |

The following table shows the contactor enable connector 730:

| Pin | Description | Mnemonic |
|---|---|---|
| 1 | Contactor Enable− | CONT EN− |
| 2 | Contactor Enable+ | CONT EN+ |

Inverter output power connections are available on all modules. A motor power cable shield clamp is also available. The shield clamp provides an electrical connection between the motor power cable shield and the drive chassis, and used to reduce electrical noise in the system. The following tables show connections for the motor power and break connectors 740 and 750:

| Pin | Description | Mnemonic |
|---|---|---|
| 4 | Chassis Ground | GND |
| 3 | 3-Phase Motor Power | W |
| 2 | 3-Phase Motor Power | V |
| 1 | 3-Phase Motor Power | U |

| Pin | Description | Mnemonic |
|---|---|---|
| 6 | Motor brake− | MBRK− |
| 5 | Motor brake+ | MBRK+ |
| 4 | Motor brake common | COM |
| 3 | +24 V brake input power (from LIM or customer supplied) | PWR |
| 2 | Resistive brake module connections (from RBM and safety string) | DBRK− |
| 1 | Resistive brake module connections (from RBM and safely string) | DBRK+ |

Figure 8:
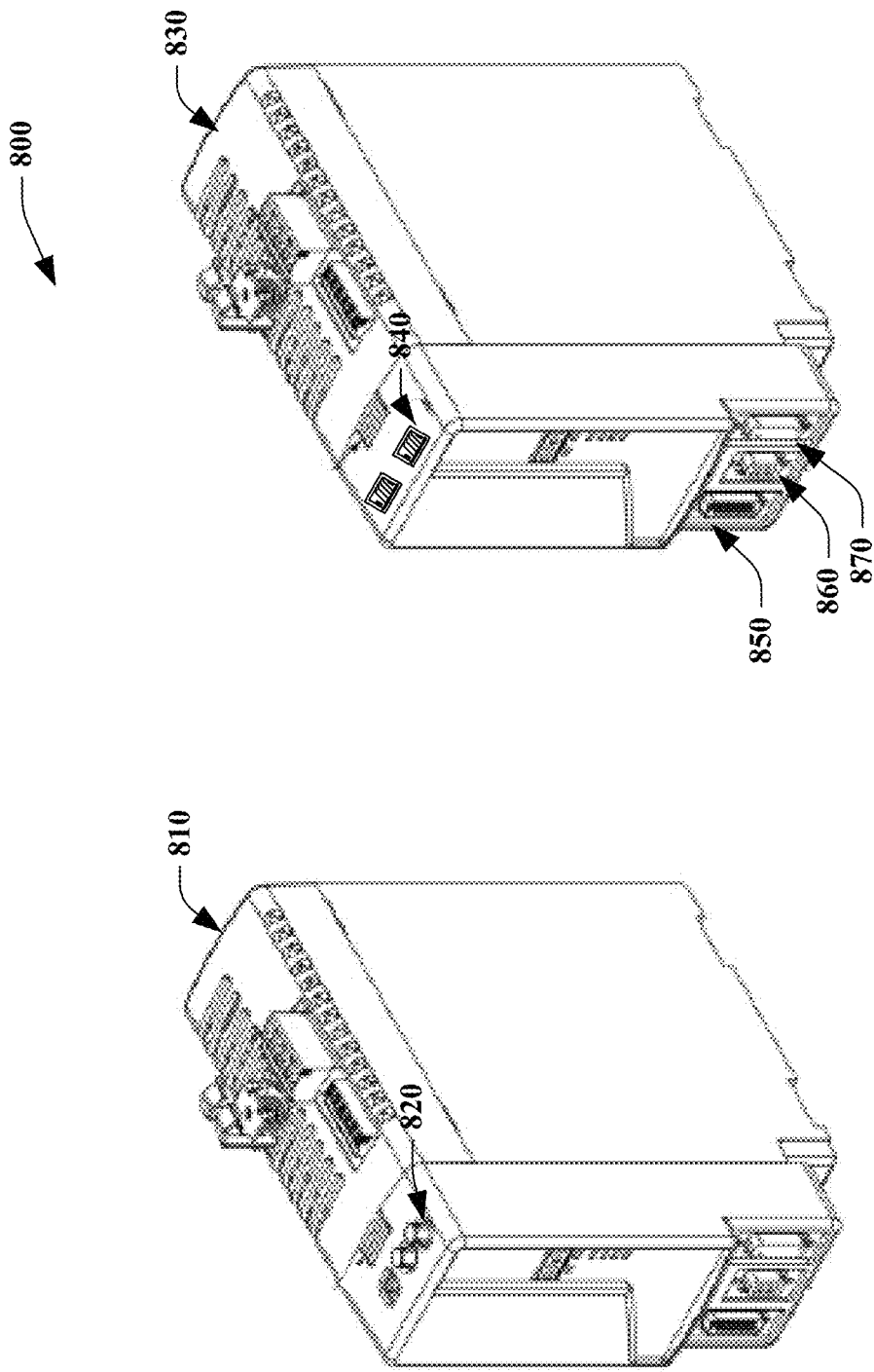
FIG. 8 is a control connections view for a modular drive.

Referring now to FIG. 8, a control module connections view 800 for a modular drive is shown. At 810, a module drive is configured with SERCOS connections 820 for communications. Similarly, a drive 830 is adapted with Ethernet connections 840 for communications. As noted above, other communications protocols are possible including adapting the drives for Internet connections. The drive 810 and 830 employ safety I/O connections 850, feedback connections 860, and I/O connections 870. The following tables illustrate example functions for the respective connections 850-870.

For the safety connector 850:

| Pin | Description | Mnemonic |
|---|---|---|
| 1 | +24 VDC Customer Supply | SPWR |
| 2 | Customer Supply Common | SCOM |
| 3 | Pulse Test Output 0 | TEST OUT0 |
| 4 | Pulse Test Output 1 | TEST OUT1 |
| 5 | Safe Stop Input 0 | SS_INPUT0 |
| 6 | Safe Stop Input 1 | SS_INPUT1 |
| 7 | Safe Stop Output Power | SS OUT PWR |
| 8 | Safe Stop Output 0 | SS_OUTPUT0 |
| 9 | Safe Stop Output 1 | SS_OUTPUT1 |
| 10 | Safe Limited Speed Input 0/ Safe Stop Input 2 | SLS INPUT0/SS INPUT2 |
| 11 | Safe Limited Speed Input 1/ Safe Stop Input 3 | SLS_INPUT1/SS_INPUT3 |
| 12 | Safe Limited Speed Output Power | SLS OUT PWR |
| 13 | Safe Limited Speed Output 0 | SLS_OUTPUT0 |
| 14 | Safe Limited Speed Output 1 | SLS_OUTPUT1 |
| 15 | Door Monitor Input 0 | DM INPUT0 |
| 16 | Door Monitor Input 1 | DM_INPUT1 |
| 17 | Lock Monitor Input 0 | LM_INPUT0 |
| 18 | Lock Monitor Input 1 | LM_INPUT1 |
| 19 | Door Control Output Power | DC OUT_PWR |
| 20 | Door Control Channel Output+ | DC_OUTPUT+ |
| 21 | Door Control Channel Output−/ 24 V Power Out | DC_OUTPUT−/24 VPWR |
| 22 | Door Control Output Common/ 24 V Common Out | DC OUT_COM/24 VCOM |
| 23 | Enabling Switch Monitor Input 0 | ESM_INPUT0 |
| 24 | Enabling Switch Monitor Input 1 | ESM_ INPUT1 |
| 25 | Safety Circuit Reset Input+ | RST+ |
| 26 | Safety Circuit Reset Input− | RST− |

For the feedback connector 860:

| Pin | Description | Mnemonic |
|---|---|---|
| 1 | Sine/A Positive Differential Input | AM+ |
| 2 | Sine/A Negative Differential Input | AM− |
| 3 | Cosine/B Positive Differential Input | BM+ |
| 4 | Cosine/B Negative Differential Input | BM− |
| 5 | Data/Index Positive Differential Input/Output | DATA+/IM+ |
| 6 | Encoder Common | ECOM |
| 7 | Encoder 9 V Power Supply | EPWR_9 V |
| 8 | Hall Commutation S3 Input | S3 |
| 9 | Positive Overtravel Input Clock Output | OT+/CLK |
| 10 | Data/Index Negative Differential Input Output | DATA−/IM− |
| 11 | Motor Thermostat | TS |
| 12 | Hall Commutation S1 Input | S1 |
| 13 | Hall Commutation S2 Input | S2 |
| 14 | Encoder 5 V Power Supply | EPWR_5 V |
| 15 | Negative Overtravel Input/Clock Output | OT−/CLK− |

For the I/O connector 870:

| Pin | Description | Mnemonic |
|---|---|---|
| 1 | 24 V Power Supply | 24 VPWR |
| 2 | Digital Input 1 | INPUT1 |
| 3 | 24 V Common | 24 VCOM |
| 4 | 24 V Power Supply | 24 VPWR |
| 5 | Digital Input 2 | INPUT2 |
| 6 | 24 V Common | 24 VCOM |
| 7 | 24 V Power Supply | 24 VPWR |
| 8 | Digital Input 3 | INPUT3 |
| 9 | 24 V Common | 24 VCOM |
| 10 | 24 V Power Supply | 24 VPWR |
| 11 | Digital Input 4 | INPUT4 |
| 12 | 24 V Common | 24 VCOM |
| 13 | — | — |
| 14 | Sine/A Positive Differential Input | SINE+/A+ |
| 15 | Sine/A Negative Differential Input | SINE−/A− |
| 16 | — | — |

-continued

| Pin | Description | Mnemonic |
|---|---|---|
| 17 | Cosine/B Positive Differential Input | COSINE+/B+ |
| 18 | Cosine/B Negative Differential Input | COSINE−/B− |
| 19 | Data/Index Positive Differential Input/Output | DATA+/I+ |
| 20 | Data/Index Negative Differential Input/Output | DATA−/I− |
| 21 | Positive Overtravel Input/Clock Output | OT+/CLK+ |
| 22 | Negative Overtravel Input/Clock Output | OT−/CLK− |
| 23 | Encoder 5 V Power Supply | EPWR_5 V |
| 24 | Encoder Common | ECOM |
| 25 | Encoder 9 V Power Supply | EPWR_9 V |
| 26 | — | — |

Figure 9:
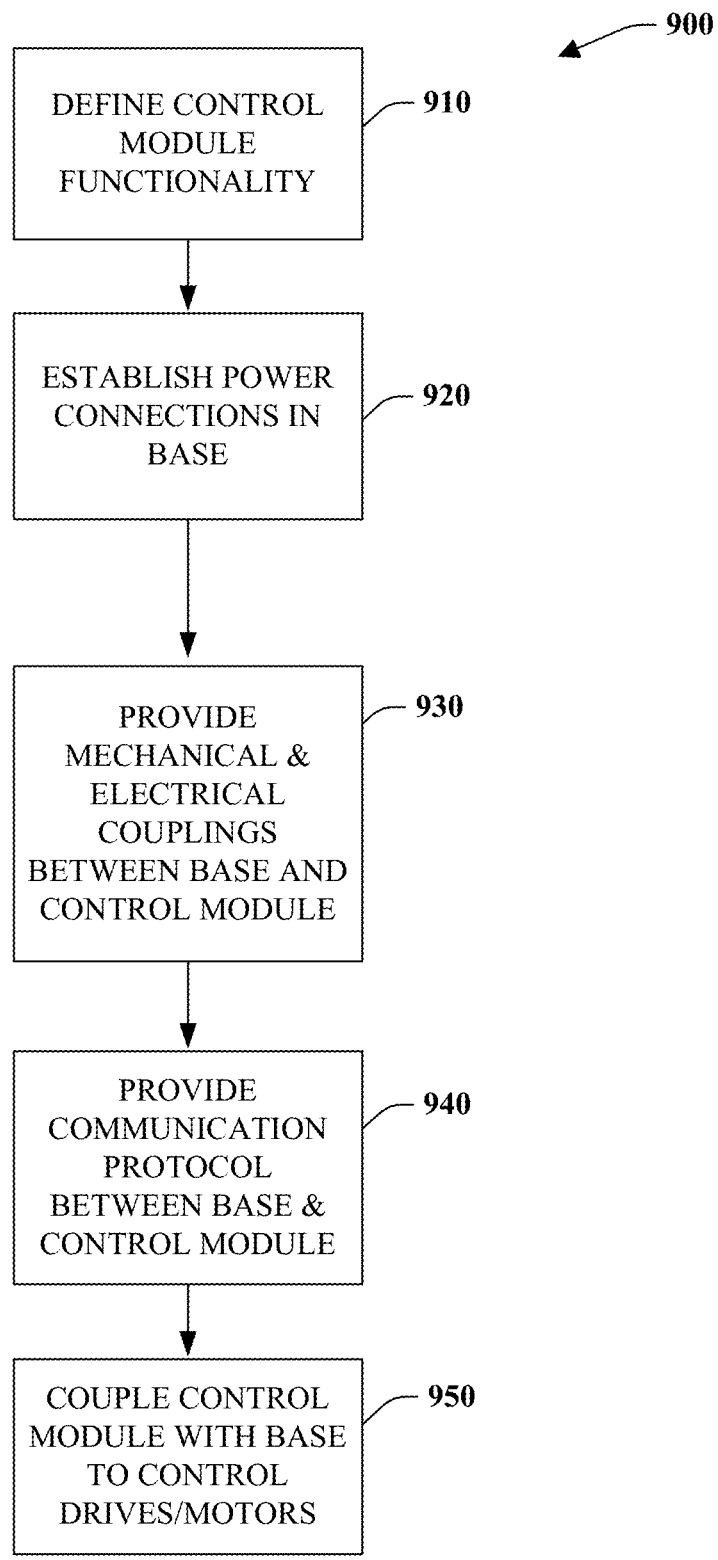
FIG. 9 is a flow diagram illustrating a modular drive control process.

FIG. 9 is a flow diagram illustrating a modular drive control process 900. While, for purposes of simplicity of explanation, the methodology is shown and described as a series of acts, it is to be understood and appreciated that the methodologies are not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology as described herein.

Proceeding to 910, control module functionality is defined. This is includes external communications functionality, network capabilities, power module communication protocols, processing capabilities, interface capabilities, I/O and feedback processing and so forth. At 920, power connections for a motor are established in a base unit. This includes power control commands, braking capabilities, and other motor power or control functions. At 930, electrical couplings are provided in the respective power and the control modules to enable electronic integration and communications for a modular drive package of such modules. This also includes mechanical fasteners or couplings to enable the control module to be easily coupled and decoupled from the power unit. At 940, communications protocols are established between the power module and the control module. Such protocol includes how the modules identify themselves to each other and how they configure themselves after the respective identification has commenced. At 950, the control module is coupled to the power module to form a modular drive controller. As noted above, additional modules can be cascaded with the control module to increase the functionality of the system.

Figure 10:
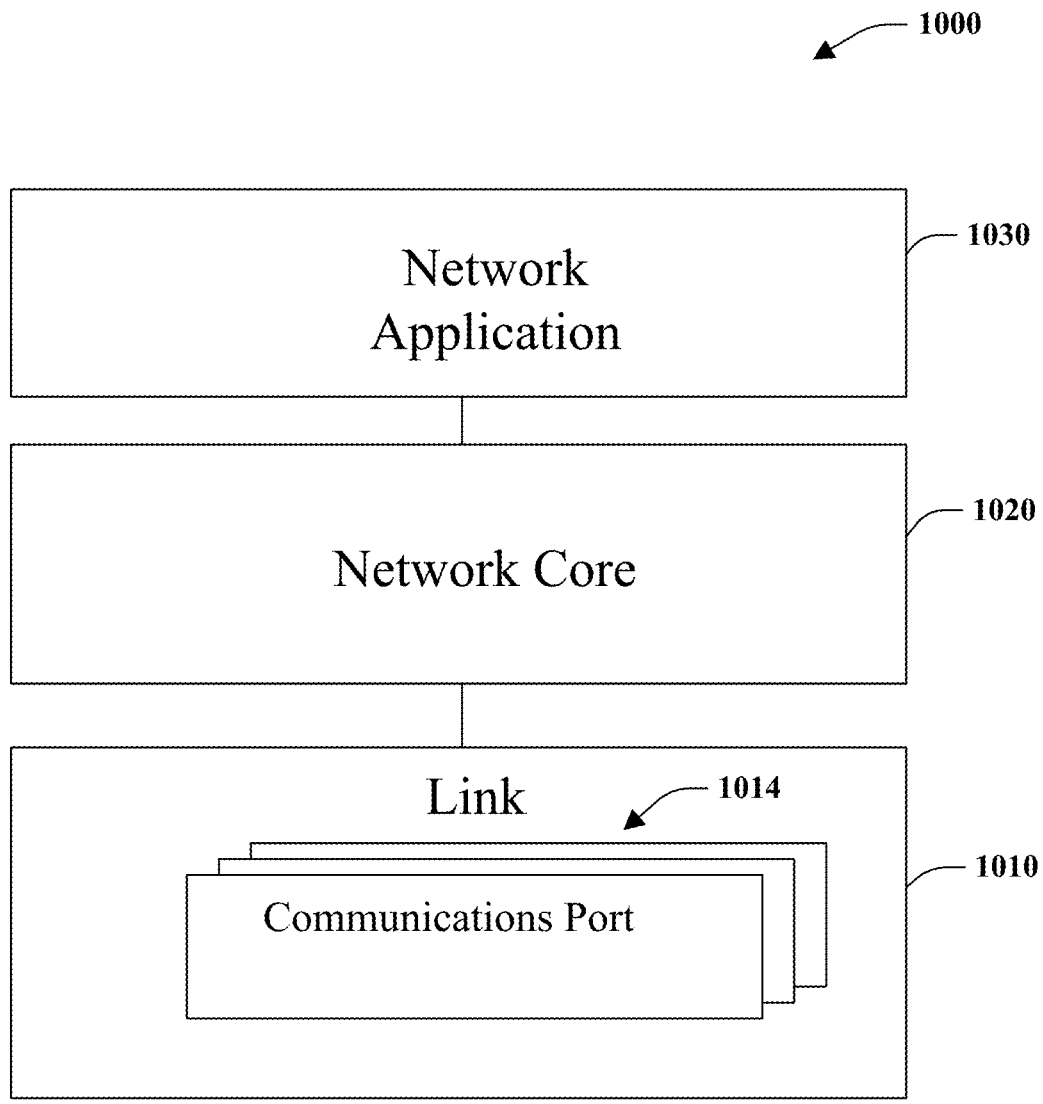
FIG. 10 illustrates example communications options between drive power modules and one or more control modules.

FIG. 10 illustrates example communications options between drive power modules and one or more control modules and/or with external systems such as PLC's or other computer applications. An industrial communications architecture 1000 is provided for an industrial automation system and can be provided as part of the control modules previously described. A link layer 1010 includes one or more communication port components 1014 that drive individual data links. Communication ports 1014 are typically installed when the system is initialized based on a product configuration. A communication port 1014 can include an unconnected message manager (UCMM), link producers, link consumers, and data link specific behavior such as encapsulation and a link device driver, for example which are described in more detail below. A core layer 1020 includes core components to provide an application to link layer 1010 interface. This can include message router services, a connection manager, and connection transports, for example. Transports can be encapsulated in a component referred to as a transport manager (not shown).

A network application layer 1030 includes network application objects that are included in the particular system or module. Application objects are typically instantiated when the system is initialized based on the respective configuration. A network application object can be defined to facilitate the use of a network stack by non-network applications such as a web and OPC-DX (OLE for Process Control Data Exchange) server applications, for example. This interface object manages the network-specific behavior such as opening, closing, and managing network connections and unconnected message transactions. One feature is to offload this detail from other applications within the respective host processor.

The system 1000 provides a layered communications architecture that facilitates communications between multiple ports 1014 and network applications 1030 while allowing data produced by an application object within a module to be produced through multiple communications ports. In one aspect, a communications stack (not shown) supports one-to-many different or same link protocols without altering its fundamental network behavior or design. For instance, the particular protocol of a message packet actually sent or received should not be particularly relevant to its fundamental or base network behavior. Providing this network abstraction supports systems or modules with multiple ports, sometimes referred to as a multi-port device. This also allows adding new link protocols in the future without re-implementing or altering the module or system's underlying behavior. In another aspect, flexible capability is provided for delivering a connection data payload to multiple destinations. For data consumption, these destinations can be network application objects or data producer objects in other communication ports. For production, the destinations can be a producer object in one or more communication ports 1014, where such behavior can be referred to as multicasting within a module. Specific examples of the link layer 1010, network core 1020, and network applications 1030 will be described in more detail below.

In another aspect, a CIP (Common Industrial Protocol) application layer 1030 communicates through a CIP core 1020 with a CIP link layer 1010. As shown, the CIP link layer supports various communications protocols such as backplane, USB, Ethernet, ControlNet, DeviceNet, and so forth, for example. Thus, the link layer 1010 supports a multi-stack architecture that allows various differing protocols to communicate across the architecture. In general, the CIP application 1030 supports interfaces to CIP core layer 1020. It is to be appreciated that CIP is an exemplary protocol and that other network protocols can be similarly adapted and interfaced. Various types of objects can be provided to support communications between layers and between components of a system. These can include CIP-aware application objects that support interfaces to the CIP core layer 1020. Link-specific application objects can be instantiated by owning a port within the respective link layer 1010. Standard CIP application objects support data flows for CIP accesses and allows direct association between port and application objects. Other applications can include Gateways to non-CIP clients, OPC/DX, Java Virtual Machine (JVM) and so forth.

The link layer 1010 includes one or more communication ports including backplane ports, USB ports, Ethernet ports, CIP ports, and other examples such as Device Network ports, for example. The various ports provide that provide access and management of link-specific protocols. This includes link-specific drivers/Interfaces to data link (e.g., network, I/O bus, and so forth). Other components in the link layer 1010 not shown include an Unconnected Message Manager, Link Producers, and Link Consumers. The CIP Core 1020 provides components for an application to link layer interface. This includes a Connection Manager (not shown) which facilitates network connection creation and management and is a facilitator for unconnected message origination. Transports in the core layer 1020 provide a connected data interface between application and link objects. The core layer 1020 can also include Message Router Services that encapsulates knowledge of message router request and response formats. The core layer 1020 can also include a registry for applications that support CIP (or other network protocol) unconnected message target behavior.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method, comprising:
    receiving, by a modular industrial drive at a first port configured to receive a plurality of a power modules, at least one power module, wherein respective power modules provide unique sets of power configurations;
    receiving, by the modular industrial drive at a second port configured to receive a plurality of a control modules, at least one control module, wherein respective control modules provide unique sets of control configurations;
    automatically, by the modular industrial drive, configuring the drive as a function of the at least one received power module and the at least one received control module; and
    processing, by a respective power module associated with one or more feedback control mechanisms of the modular industrial drive, the one or more feedback control mechanisms.

2. The method of claim 1, employing a protocol component of a received power module to automatically negotiate functionality between the received power module and a received control module.

3. The method of claim 1, employing a protocol component of a received control module to automatically negotiate functionality between the received control module and a received power module.

4. The method of claim 1, employing a communication interface connector of the received control module to communicatively couple the modular industrial drive to an external network or external device.

5. The method of claim 4, wherein a received control module is configured to communicate with the external device over an Internet.

6. The method of claim 4, the wherein external device is an industrial controller configured to provide additional computing and control capabilities.

7. The method of claim 1, further comprising one or more input/output (I/O) components that are processed by a respective associated control module from the at least one received control module.

8. The method of claim 1, further comprising employing an optical port of the modular industrial drive to communicate with a received control module.

9. The method of claim 1, employing an Ethernet port of the modular industrial drive to communicate with a received control module.

10. The method of claim 1, wherein a received control module is configured as a programmable controller to control one or more drives.

11. A non-transitory computer-readable medium having instructions stored thereon that, in response to execution, cause a system including a processor to perform operations comprising:
    receiving, by a modular industrial drive at a first port configured to receive a plurality of a power modules, at least one power module, wherein respective power modules provide unique sets of power configurations;
    receiving, by the modular industrial drive at a second port configured to receive a plurality of a control modules, at least one control module, wherein respective control modules provide unique sets of control configurations;
    automatically, by the modular industrial drive, configuring the drive as a function of the at least one received power module and the at least one received control module; and
    processing, by a respective power module associated with one or more feedback control mechanisms of the modular industrial drive, the one or more feedback control mechanisms.

12. The non-transitory computer-readable medium of claim 11, employing a protocol component of the received power module to automatically negotiate functionality between the received power module and the received control module.

13. The non-transitory computer-readable medium of claim 11, employing a protocol component of the received control module to automatically negotiate functionality between the received control module and the received power module.

14. The non-transitory computer-readable medium of claim 11, employing a communication interface connector of the received control module to communicatively couple the modular industrial drive to an external network or external device.

15. The non-transitory computer-readable medium of claim 14, wherein the received control module is configured to communicate with the external device over an Internet.

16. The non-transitory computer-readable medium of claim 14, the wherein external device is an industrial controller configured to provide additional computing and control capabilities.

17. The non-transitory computer-readable medium of claim 11, further comprising one or more input/output (I/O) components that are processed by a respective associated MPI from the at least one received MCI.

18. The non-transitory computer-readable medium of claim 11, further comprising employing an optical port of the modular industrial drive to communicate with the received control module.

19. The non-transitory computer-readable medium of claim 11, employing an Ethernet port of the modular industrial drive to communicate with the received control module.

20. The non-transitory computer-readable medium of claim 11, wherein the received control module is configured as a programmable controller to control one or more drives.

* * * * *